(12) United States Patent
Journet (10) Patent No.: US 8,941,419 B2
(45) Date of Patent: Jan. 27, 2015

(54) M-ARY SEQUENCE CLOCK SPREADING (71) Applicant: ST-Ericsson SA, Plan-les-Ouates (CH)

(72) Inventor: Fabien Journet, Grenoble (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 14/240,571

(22) PCT Filed: Sep. 27, 2012

(86) PCT No.: PCT/EP2012/069052
§ 371 (c)(1),
(2) Date: Feb. 24, 2014

(87) PCT Pub. No.: WO2013/045535
PCT Pub. Date: Apr. 4, 2013

(65) Prior Publication Data
US 2014/0247073 A1    Sep. 4, 2014

Related U.S. Application Data

(60) Provisional application No. 61/548,755, filed on Oct. 19, 2011.

(30) Foreign Application Priority Data

Sep. 29, 2011    (EP) ..................................... 11306253

(51) Int. Cl.
*H03K 21/00*    (2006.01)
*H03K 21/08*    (2006.01)
*H04B 15/06*    (2006.01)

(52) U.S. Cl.
CPC ................ *H03K 21/08* (2013.01); *H04B 15/06* (2013.01)
USPC ........................... 327/115; 327/156; 327/159

(58) Field of Classification Search
USPC ................. 327/114, 115, 117, 156, 159, 160; 375/373, 376
See application file for complete search history.

(56) References Cited

U.S. PATENT DOCUMENTS 4,654,859 A    3/1987  Kung et al.
7,386,026 B1   6/2008  Gold
(Continued)

OTHER PUBLICATIONS

International Search Report issued in corresponding International application No. PCT/EP2012/069052, date of mailing Dec. 10, 2012.
Extended European Search Report issued in corresponding European application No. EP 11 30 6253, date of completion Mar. 7, 2012.
(Continued)

*Primary Examiner* — Long Nguyen
(74) *Attorney, Agent, or Firm* — Patent Portfolio Builders PLLC (57) ABSTRACT

The invention concerns a device for providing a spread frequency clock signal, comprising: —an input (51) to receive a first clock signal having a first frequency; —a programmable clock divider (52) to generate the spread frequency clock signal from the first clock signal; —a first Feedback Shift Register (21), FSR, comprising at least one stage, the FSR being adapted to generate any of an odd number M of different values, the FSR being adapted to pseudo-randomly generate a first sequence of first output values, each corresponding to one of said M different values, and to provide a first output value, according to the sequence, during each clock cycle of the spread frequency clock signal; —a control unit (22) adapted to select a division factor of the programmable clock divider based on the first output value of the FSR during each clock cycle of the spread frequency clock signal; —an output (53) for providing the spread frequency clock signal.

15 Claims, 5 Drawing Sheets

(56) References Cited

U.S. PATENT DOCUMENTS

| | | | |
|---|---|---|---|
| 7,881,419 B2 * | 2/2011 | Shin | 375/376 |
| 2005/0008113 A1 * | 1/2005 | Kokubo et al. | 375/376 |
| 2005/0069019 A1 | 3/2005 | Kaizuka | |
| 2010/0244976 A1 | 9/2010 | Kerr et al. | |
| 2012/0235717 A1 * | 9/2012 | Hirai et al. | 327/156 |

OTHER PUBLICATIONS

Kajiwara, Akihiro, et al., "PLL Synthesizer for Fast Frequency Hopping Spread Spectrum Communication," 433a Electronics and Communications in Japan, Part I: Communications, vol. 74, No. 1, Jan. 1, 1991, pp. 105-114, New York, NY, US, XP000234712, ISSN: 8756-6621.

* cited by examiner

M-ARY SEQUENCE CLOCK SPREADING

BACKGROUND

1. Technical Field

The present invention generally relates to techniques for reducing electromagnetic interference and in particular to clock spreading.

It finds application in particular, while not exclusively, in Radio Frequency components of Digital Signal Processors (DSP).

2. Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

In Radio Frequency components implementing digital blocks, synchronous logic can generate spurs at every multiple or divisor of a clock frequency. In order to improve digital signatures and to decrease electromagnetic interferences, a technique called clock spreading can be used in order to spread the energy in a large range of frequencies. Electromagnetic interferences can be due to electromagnetic induction or electromagnetic radiation from an external source.

Thus, the goal of such technique is to change the length of the clock period, so that the clock period looks random.

According to systems of the prior art, the frequency of the clock can be varied either by modulating a Phase Locked Loop (PLL), which is an analogical approach, or by changing some clock division ratio, which is a digital approach.

If digital hardware implemented data with uniform distribution is required, Pseudo Random Binary Sequence (PRBS) can be used, which can be implemented with a Linear Feedback Shift Register (LFSR).

Figure 1:
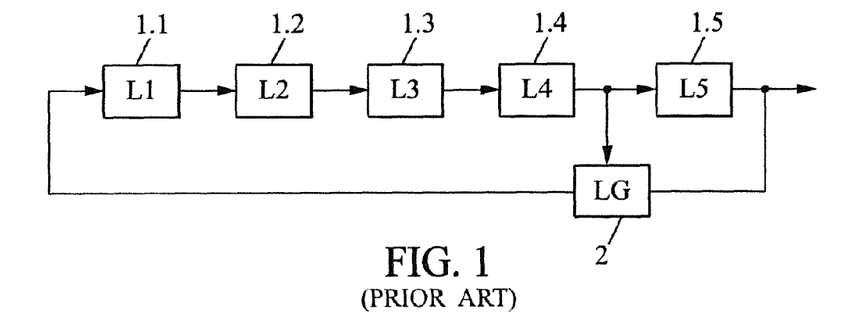
FIG. 1 illustrates a binary Linear Feedback Switch Register LFSR according to the prior art.

Referring to FIG. 1, there is shown a LFSR according to the prior art. The LFSR comprises a plurality of latches 1.1-1.5, which are serially connected, each latch storing a binary value. At each clock cycle, the binary values are shifted, from latch 1.1 to latch 1.2, from latch 1.2 to latch 1.3, from latch 1.3 to latch 1.4 and from latch 1.4 to latch 1.5. The binary value of latch 1.5 is used as output of the LSFR. The binary value of latch 1.4 is transmitted to a logic gate 2 (for example a XOR gate) with the binary value outputted by latch 1.5 in order to inject a new binary value in latch 1.1.

Thus, an N bits LFSR (5 bits on FIG. 1) can generate two sequences:
 only 0 when the LFSR is initialized to 0, and
 all numbers from 1 to $2^n-1$ when initialized to anything else.

LFSR implements a polynomial in Galois field $[0:1]^n$, which coefficient can thus be either 0 or 1. Most Significant Bit (MSB) is 1 and defines the length of the sequence which is $2^n-1$.

Then, based on the value outputted by latch 1.5 and based on high speed clock, some calculation can decide when the spread clock toggles. The clock signal is then spread depending on the output value of the LFSR.

However, according to the system illustrated on FIG. 1, all LFSR sequences are odd, as their length is equal to $2^n-1$. The obtained statistics for the value outputted by the LFSR are:
 $2^{n-1}$ times the binary value '1';
 $2^{n-1}-1$ times the binary value '0'.

Thus, the distribution of the binary values is non-centred, resulting in a frequency that is tricky to calculate or to implement. Indeed, such an implementation does not allow to easily determining frequencies to be associated with each binary value, so that an average frequency over a whole period is equal to a target frequency.

In addition, time spreading of the clock should be well known because of some requirements of RF components such as backend constraints or minimum throughput. This is not enabled by the systems of the prior art, for which minimum frequency is hard to predict and is very low on existing implementations.

Thus, there is a need to improve the accuracy and efficiency associated with clock spreading.

SUMMARY OF THE INVENTION

To address these needs, a first aspect of the present invention relates to a device for providing a spread frequency clock signal, comprising:
 an input to receive a first clock signal having a first frequency;
 a programmable clock divider to generate the spread frequency clock signal from the first clock signal;
 a first Feedback Shift Register, FSR, comprising at least one stage, the FSR being adapted to generate any of an odd number M of different values, the FSR being adapted to pseudo-randomly generate a first sequence of first output values, each corresponding to one of the M different values, and to provide a first output value, according to the sequence, during each clock cycle of the spread frequency clock signal;
 a control unit adapted to select a division factor of the programmable clock divider based on the first output value of the FSR during each clock cycle of the spread frequency clock signal;
 an output for providing the spread frequency clock signal.

Thus, the device comprises a stage that can deliver an odd number M of given different values. This enables to overcome the limitations of the prior art, according to which the FSR delivers binary values. Accuracy of the clock spreading is thus increased. In addition, the values of the FSR are shifted at each output clock cycle (clock cycle of the spread frequency clock signal), which enables to reduce power consumption. In complement, the clock gating can be applied between two consecutive output clock cycles to further reduce power consumption.

According to some embodiments, the control unit (22;27-28) selects one of N division factors for each of the M different values, where N is an integer lower than or equal to M, for use by the programmable clock divider.

This ensures that a mapping is established between the values outputted by the FSR and the division factors.

In complement, the N division factors correspond to N frequency values, each frequency value being the first frequency divided by the respective division factor and wherein the N frequency values include a target average frequency value having an associated target average division factor.

Thus, while considering an odd number M of values, for example three values, one can choose to associate the target average frequency value with one of these values and two other frequency values on both sides of the target average frequency value with the two other values. The accuracy associated with clock spreading is thus enhanced on a given number of cycles. It is to be noted that frequency value can either refer to a target frequency or to a division factor of the clock frequency (meaning the frequency of the clock that is spread). In complement, the control unit (22;27-28) selects the division factor based on a mapping between the M first output values and the N division factors $D_i$, i varying between 0 and n−1, $D_0$ being the target average division factor, according to the following rules:

$$a_0 + a_1 + \ldots + a_{N-1} = M$$

$$a_0 * D_0 + a_1 * D_1 + \ldots + a_{N-1} * D_{N-1} = M * D_0$$

where $a_i$ represents a number of output values from the M first output values that are mapped on the corresponding factor $D_i$.

This enables to obtain an accurate clock spreading while having an increased number of configurations. A satisfying trade-off between frequency and time accuracies can thus be chosen.

In complement, the first output values are comprised between 0 and M−1, and the output value 0 is mapped on the target division factor $D_0$.

According to some embodiments of the invention, the numbers of division factors above and below the target division factor can be equal. In some embodiments, M is equal to N.

According to some embodiments, the control unit further comprises a counter, which is adapted to update, at each clock cycle of the spread frequency clock signal, a count value based on the difference between the division factor selected by the control unit and the target average division factor, the count value being equal to zero when the device is powered up.

This enables to store information which relates to a time excursion of the spread clock compared to a non-spread clock, which frequency would be equal to the target frequency value.

In complement, upon reception of a re-centre request from a component of a system comprising the device, the control unit is adapted to select a division factor of the programmable clock divider being adapted to decrease the absolute value of the count value.

These embodiments enable to re-centre clock spreading when an external component requires an increased time accuracy. The device according to the invention is thus flexible and can enable to accurately fix a trade-off between time accuracy and spread frequency.

According to some embodiments, the spread frequency clock signal is generated from the first clock signal by spreading rising edges and falling edges Thus, the efficiency of the device is enhanced by spreading both high and low edges of the output clock signal. This enables to create longer clock sequence without impacting on digital constraint.

In complement, the device can further comprise a second FSR, the second FSR being adapted to generate any of a number M2 of different values, where M2 is equal to a power of two or to an odd number greater than one, wherein the second FSR is adapted to pseudo-randomly generate a second sequence of second output values, each second value corresponding to one of the M2 different values, and to provide a second output value, according to the second sequence during each spread clock cycle. During each clock cycle of the spread frequency clock signal, the period of the spread frequency clock signal is a number of first periods of the first clock signal, which is equal to the division factor selected by the control unit based on the M1 different values. The control unit is further adapted to allocate each first period from the number of first periods to high cycle or low cycle, based on the second output value provided by the second FSR.

The second output values of the second FSR can then be used to spread low and high edges of the output clock signal.

Alternatively, the first FSR comprises at least two stages, the pseudo-randomly generated first output value being provided by a first stage among the at least two stages of the first FSR. During each clock cycle of the spread frequency clock signal, a period of the spread frequency clock signal comprises a number of first periods of the clock signal, which is equal to the division factor selected by the control unit, and wherein the control unit is further adapted to allocate each first period from the number of first periods to high cycle or low cycle based on a second output value provided by a second stage among the at least two stages of the first FSR.

This enables to control clock spreading of both raising and falling edges with one unique FSR, thus reducing costs and congestion of the device.

According to some embodiments of the invention, the first FSR comprises a configurable number of stages Thus, the length of the pseudo random sequence can be varied depending on given constraints and configuration. A second aspect of the invention concerns method of providing a spread frequency clock signal, comprising:
  receiving a first clock signal having a first frequency;
  generating the spread frequency clock signal from the first clock signal;
  pseudo-randomly generating, during each clock cycle of the spread frequency clock signal, an output value among M different values, where M is an odd number greater than one;
  selecting a division factor based on the output value during each clock cycle of the spread frequency, the division factor being used to generate the spread frequency clock signal;
  providing the spread frequency clock signal.

A third aspect of the invention relates to a computer program product comprising a non transitory computer readable medium having stored thereon computer program instructions loadable into a computing device and adapted to—when loaded into and executed by the computing device—cause the computing device to perform a method according to anyone of the embodiments of the second aspect of the invention.

BRIEF DESCRIPTION OF THE DRAWINGS

Embodiments of the present invention are illustrated by way of example, and not by way of limitation, in the figures of the accompanying drawings, in which like reference numerals refer to similar elements and in which.

DESCRIPTION OF PREFERRED EMBODIMENTS

Figure 2:
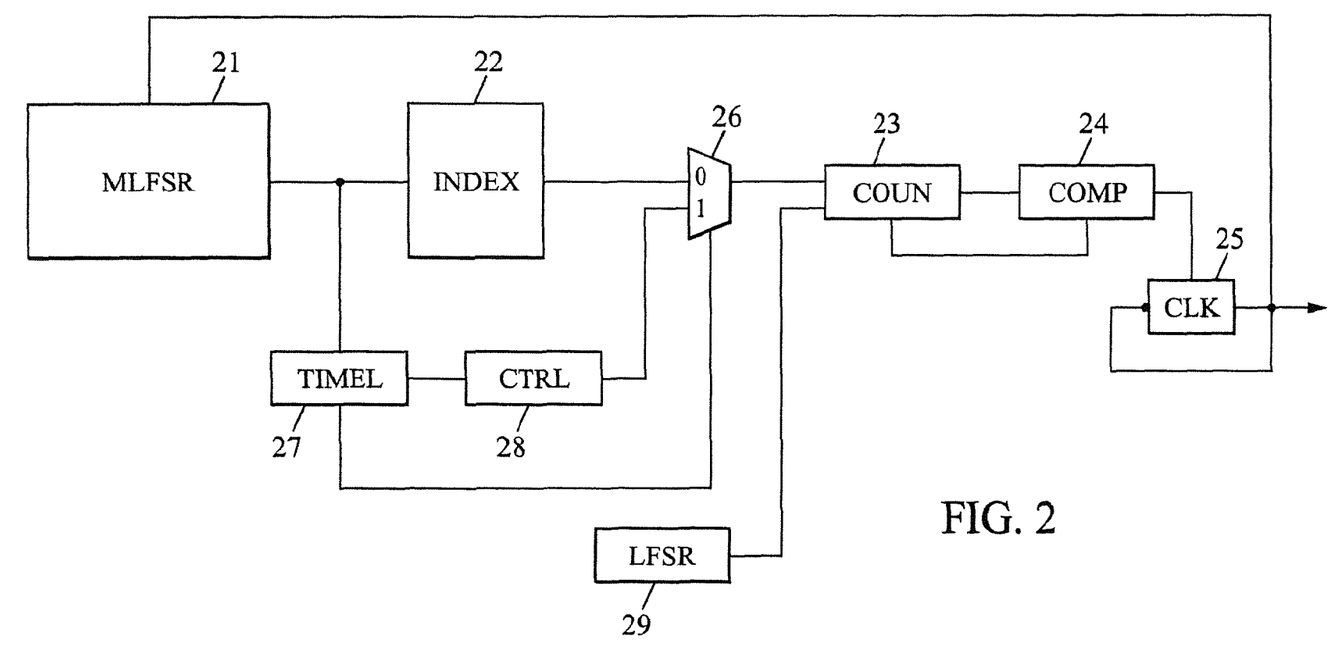
FIG. 2 represents a device for spreading frequency of a cyclic clock signal according to some embodiments of the invention.

Referring to FIG. 2, there is shown a device for spreading frequency of a cyclic clock signal according to some embodiments of the invention.

The device comprises a "M"ary LFSR 21, noted hereafter MLFSR, meaning that the MLFSR 21 is arranged to pseudo-randomly generate values that are comprised between 0 and M−1, M being an odd number greater than two, contrary to the systems of the prior art that generate binary values.

Thus, the present invention proposes to use pseudo random sequences outside base 2, fitted on a number of dividers available from system specification (on particular based on maximum and minimum required frequencies, and on high clock frequency). For example, this number can be any odd number such as 5, 7, 11, etc. According to some embodiments of the invention, a prime number is chosen. This enables to improve the efficiency of the method.

Figure 3:
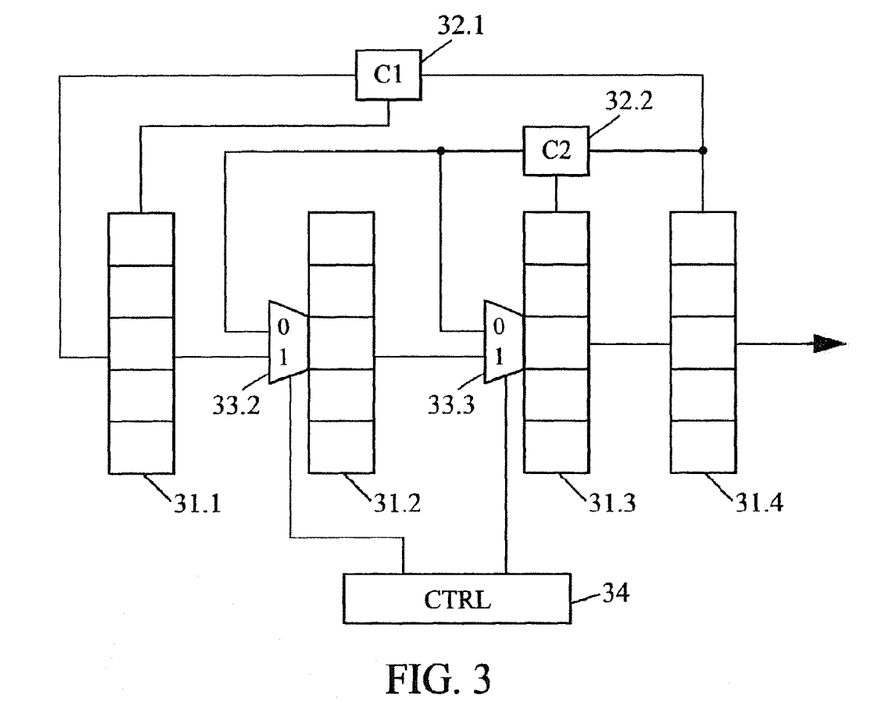
FIG. 3 illustrates a "M-ary" LFSR to be included in the device of FIG. 2, according to some embodiments of the invention.

Referring now to FIG. 3, there is shown in detail a structure of the MLFSR 21 according to some embodiments of the invention. The MLFSR 21 comprises four registers 31.1-31.4, each register comprising a value expressed in base 5 (from 0 to 4). Each register can also be referred as a stage in what follows. Thus, in this specific example, M is equal to 5. However, as previously explained, no restriction is attached to the number M, which is odd, and which can be a prime number. In addition, no restriction is attached to the number n of stages (registers) that are considered. In this specific example, n is equal to 4 (which is configurable as it will be explained in what follows), but can be increased, when one wants to increase the length of the sequence of generated numbers.

Each register can store a value which is one hot wire coded, meaning that it comprises several latches coded on one bit, only one of the latches having a bit equal to 1. This enables each register to store a value expressed in base 5. At each output clock cycle (meaning the spread clock signal of an output clock 25 of the device represented on FIG. 2), the values in base 5 are shifted from register 31.1 to register 31.2, from register 31.2 to register 31.3 and from register 31.4 to register 31.4. The value of 31.4 is used as output, the output being expressed in base 5. The values are only shifted at each output clock cycle (clock cycle of the spread frequency clock signal), and not at each cycle of the high speed clock. Between two output clock cycles, clock gating can be used before shifting the values thus enabling to reduce power consumption (number of clock cycle needed is linked to the average output frequency only).

In addition, to have a pseudo random sequence, the MLFSR 21 forms a loop. To this end, the MLFSR 21 comprises a first calculation unit 32.1. A new value $P_{n,1}$ to be stored in the register 31.1 can be calculated by the first calculation unit 32.1 based on the previous value $P_{p,1}$ stored in the latch 31.1 and on the previous value $P_{p,4}$ contained in the latch 31.4.

For example, the following formula can be applied:

$$P_{n,1} = P_{p,1} + 2 \ast P_{p,4};$$

where each value is expressed in base 5.

Thus, if the register 31.1 initially contains the value '3' and if the register 31.4 initially contains the value '2', the new value to be stored in the register 31.1 is equal to (3+2*2) modulo 5=2.

Thus, given a 'M'-basis with n registers, M being prime and proper MLFSR being used, two sequences can be generated, a first sequence having a length equal to one (comprising only '0') when the MLFSR is initialized to 0 and a second sequence having a length equal to $M^n-1$, when the MLFSR is initialized to any other number.

In the second sequence, 0 appears $M^{n-1}-1$ times and any other number from 1 to M−1 appears $M^{n-1}$ times.

According to some embodiments of the invention, the number n of stages is controllable. To this purpose, the MLFSR 21 can further comprise a second calculation unit 32.2, a first multiplexer 33.2, a second multiplexer 33.3, and a controlling unit 34.

The controlling unit 34 is adapted to control both first and second multiplexers 33.2 and 33.2. The first multiplexer 33.2 is inserted between the registers 31.1 and 31.2. The second multiplexer 33.3 is inserted between the registers 31.2 and 31.3. The first multiplexer 33.2 is adapted to receive as inputs the output of the second calculation unit 32.2 and the output of the register 31.1. The second multiplexer 33.3 is adapted to receive as inputs the output of the second calculation unit 32.2 and the output of the register 31.2. The output of each of the first and second multiplexers is controlled by the controlling unit 34, depending on a number of desired stages for the MLFSR 21, the number of stages corresponding to the effective number n of registers that are used. As previously explained, the number n determines the length of the generated sequence (which is equal to $M^n-1$).

For example, if four effective stages are desired (due to system requirements for example), then n is equal to four and the controlling unit 34 can control the first multiplexer 33.2 so that it forwards the output of the register 31.1 to the register 31.2 at each output clock cycle and can control the second multiplexer 33.3 so that it forwards the output of the register 31.2 to the register 31.3 at each clock cycle of the spread frequency clock signal. The sequence length of the values delivered by the MLFSR 21 is then equal to $5^4-1=624$.

If now three effective stages are desired (due to system requirements for example), then n is equal to three and the controlling unit 34 can control the first multiplexer 33.2 so that it forwards the output of the second calculation unit 32.2 to the register 31.2 at each output clock cycle and can control the second multiplexer 33.3 so that it forwards the output of the register 31.2 to the register 31.3 at each clock cycle. Thus, the register 31.1 is not used as the value that it stored is not shifted to the other registers 31.2-31.4. The value that is injected by the second calculation unit 33.2 in the register 33.2 is calculated based on the previous values in register 31.3 and register 31.4. The sequence length of the values delivered by the MLFSR 21 is then equal to $5^3-1=124$.

If now two effective stages are desired (due to system requirements for example), then n is equal to two and the controlling unit 34 can control the second multiplexer 33.2 so that it forwards the output of the second calculation unit 32.2 to the register 31.3 at each output clock cycle. According to some embodiments, the first multiplexer 33.2 can also be inhibited by the controlling unit 34. Thus, the registers 31.1 and 31.2 are not used as the values that are stored in them are not shifted to the other registers 31.3-31.4. The value that is injected by the second calculation unit 33.2 in the register 33.3 is calculated based on the previous values in register 31.3 and register 31.4. The sequence length of the values delivered by the MLFSR 21 is then equal to $5^2-1=24$.

On FIG. 3, MLFSR 21 has a controllable number n of effective registers that can vary between two and four. However, no restriction is attached to these variations, providing there is a sufficient number of multiplexers, calculation units and registers are added in the MLFSR 21. In addition, MLFSR 21 can also reduce the number n of effective registers to one register, by adding a third calculation coupling the output of the register 31.4 to its input.

Based on system requirements and available frequency clock, the number of registers can be optimized.

In what follows, we consider a clock frequency (also referenced as first frequency) of 1248 Megahertz (MHz). A given high frequency constraint is defined as 208 MHz, which is equal to the clock frequency divided by six. A given low frequency constraint is defined as 124.8 MHz, which is equal to the clock frequency divided by ten. A target frequency is chosen as 156 MHz.

Thus, the available division ratios are 6, 7, 8, 9 and 10, which gives a base 5. No restriction is attached to the base considered. Indeed, the base depends on the system constraints and the frequency clock. The example of base 5 is only given for the sake of better understanding.

Referring back to FIG. 2, the device further comprises an index 22. The index 22 is adapted to map each value that can be delivered by the MLFSR (which is comprised between 0 and 4 as it has been previously explained) on a number N of division factors of the clock frequency, which are comprised between 6 and 10, for example.

For example, the index 22 can map the output value '0' of the MLFSR 21 on division factor '8' (corresponding to the target average frequency value of 156 MHz).

Then the index 22 can map the output value '1' of the MLFSR 21 on division factor '6' (corresponding to a frequency of 208 MHz), the output value '2' of the MLFSR 21 on division factor '7' (corresponding to a frequency of 178.2857 MHz), the output value '3' of the MLFSR 21 on division factor '9' (corresponding to a frequency of 138.6667 MHz) and the output value '4' of the MLFSR 21 on division factor '10' (corresponding to a frequency of 124.8 MHz).

It is thus ensured that the target average frequency value over a sequence of $M^n-1$ output values of the MLFSR 21 will be equal to 156 MHz, whatever the number n of effective stages. An equilibrated distribution around the target average frequency value is ensured.

However, it is possible to have an equilibrated distribution even when N is lower than M. For example, N can be equal to three, with the three possible division factors being '6', '8' and '10'. A possible mapping is then: output value '0' is mapped on division factor '8', output values '1' and '2' are mapped on division factor '6' and output values '3' and '4' are mapped on division factor '10'.

It is also possible to map several output values on the target division factor '8'. For example, output values '0', '2' and '3' can be mapped on division factor '8', output value '1' can be mapped on division factor '6' and output value '4' can be mapped on division factor '10'.

Thus, any combination can be implemented, provided the following equations are respected:

$$a_0+a_1+\ldots+a_{N-1}=M$$

$$a_0*D_0+a_1*D_1+\ldots+a_{N-1}*D_{N-1}=M*D_0$$

where $D_i$ represents the division factor of index i, i varying between 0 and N−1, and where $a_i$ represents a number of output values from the M first output values that are mapped on the corresponding factor D.

The device further comprises a counter 23. In the example considered here, the counter 23, is a three bit Gray counter. However, no restriction is attached to the type of counter that is considered. The counter 23 is initialized based on the value that is received from the index 22 (division factor). At each clock cycle, the counter 23 is decreased by one. At each clock cycle, a comparator 24 is adapted to detect if the counter 23 has reached zero. If this is the case, the counter 23 is reinitialized based on the value that is outputted by the index 22 and the comparator 24 is adapted to change the edge of a clock 25. The clock 25 is adapted to generate the spread output clock signal. Thus, the counter 23 is adapted to determine an operation frequency, and in turn, frequency of the spread output clock signal. The counter 23 and the comparator 24 together form a programmable clock divider. However, no restriction is attached to the type of programmable divider to use.

In addition, a multiplexer 26 can be comprised between the index 22 and the counter 23. The multiplexer 26 receives as input the output value of the index 22 and an output value of a controller 28 (which will be described hereafter). The multiplexer 26 is controlled by a request from a component of a system comprising said device. Time track counter 27 is inserted between the controller 28 and the MLFSR 21.

The time track counter 27 is adapted to receive each value that is outputted by the MLFSR 21 at each output clock cycle. For example, the time track counter 27 can be a seven bits counter. The time track counter 27 is also adapted to map the values outputted by the MLFSR 21 to obtain the corresponding frequency division factor (as it has been further detailed with reference to the index 22). The time track counter 27 can then update a counter value (initialized to zero) by determining the difference between the frequency division factor (varying between 6 and 10 in the considered example) and the target average division factor (8 in the considered example). Thus, when the MLFSR 21 outputs the value '4' at a given output clock cycle, this value corresponds to the division factor '10', and the value '+2' is then added in the time track counter 27. Based on the counter value, it can be determined a time shift excursion compared to a non-spread clock (i.e. with a constant clock frequency of 156 MHz). When needed by any components of a system comprising the device according to the invention, the clock spreading according to the invention can be re-centred. For example, such components can require an improved time accuracy during short period and thus need a reduction of the absolute value of the counter value. It is to be noted that, alternatively, the counter value can be calculated based on the determined operation frequency, which corresponds to the high frequency clock divided by the division factor mapped on the output value of the MLFSR 21.

The external components requiring an improved time accuracy can then send a re-centre request to the controller 28. The controller 28 can then control the multiplexer 26 to take the output value of the controller 28 as input. The controller 28 then delivers an output value, which enables to decrease the absolute value of the counter value, and thus to reduce the time excursion compared to a 156 MHz signal. Then, the controller 28 can toggle between three centred division factors (7, 8 and 9).

The time track counter 27, controller 28 and index 22 together form a control unit to generate a value to control the programmable clock divider.

According to some embodiments, the device can further comprise a supplementary LFSR 29. In what follows, we consider that the LFSR 29 is a classical LFSR having a binary output. However, no restriction is attached to the type of LFSR that is considered. For example, the LFSR 29 can be a MLFSR, which structure is similar to the MLFSR 21. Alternatively, the MLFSR can comprise a number n2 of stages, n2 being equal to or greater than unity, and can output a number M2 of different values, M2 being odd and greater than or equal to three. In the considered example, the LFSR 29 delivers binary values, such as the LFSR according to the prior art that has been represented on FIG. 1. For example, the LFSR 29 comprises five serially connected registers. In what follows, the references of the LFSR of FIG. 1 are used to refer to the LFSR 29. The values in the registers (latches on FIG. 1) of the LFSR 29 can be shifted at each output clock cycle (clock cycle of the spread frequency clock signal), in order to decrease power consumption of the device.

The counter 23 further comprises a selection unit (not represented on FIG. 2), which is adapted to receive binary output values stored in some registers of the LFSR 29, each time counter 23 is reinitialized (corresponding to an output clock cycle). Based on these binary output values and based on the frequency division factor received from the index 22 (or from the controller 28), the counter 23 and the controller 24 can control the repartition of the rising edge and of the falling edge for each spread period, the spread period comprising a number of first periods of the clock signal, which is equal to the received frequency division factor. For example, when the frequency division factor is equal to 10, one can consider that we have 10 periods of the high frequency clock. The 10 periods can be split in 6 periods for the high state and 4 periods for the low state of the output clock, or in 7 periods for the high state and 3 periods for the low state of the output clock, etc. In a similar way, when the frequency division factor is equal to 9, one can consider that we have 9 periods of the high frequency clock. The 9 periods can be split in 6 periods for the high state and 3 periods for the low state of the output clock, or in 5 periods for the high state and 4 periods for the low state of the output clock, etc. The same principle can be applied for the other values of division factors. Such mapping can be used by using cascaded multiplexers for each frequency division factor for example, the multiplexers being enabled by the output values of the LFSR 29 for example. Thus, the falling edge of the output clock is also spread. Falling edge distribution has no functional impact and there is no constraint on its distribution. As sequence length of MLFSR 21 and LFSR 29 are different, global sequence length of the output clock is enlarged by a big factor. It is to be noted that the falling edge spreading by use of the LFSR 29 is optional and can be controlled by software, as number of stages of MLFSR.

Alternatively, instead of the LFSR 29, falling edge can be spread by considering a value that is outputted by a register of the MLFSR 21. The considered register can be any register (preferably a different one than the register 31.4, which already outputs the value used for the determination of the division factor). Thus, for example, the value stored in register 31.3 can be used at each clock cycle of the spread frequency clock signal so that the controller 24 can control the repartition of the rising edge and of the falling edge for each spread period.

It is to be noted that using the output value of a first LFSR to determine a frequency division factor to spread a clock signal and the output value of a second LFSR to determine the repartition of rising edge and of the falling edge for each spread period, is inventive by itself.

Thus, another aspect of the invention concerns a device for providing a spread frequency clock signal, comprising:
- an input (51) to receive a first clock signal having a first frequency;
- a programmable clock divider (23;24;52) to generate the spread frequency clock signal from the first clock signal;
- a first Feedback Shift Register (21), FSR, comprising at least one stage (31.1-31.4), said FSR being adapted to pseudo-randomly generate a first sequence of first output values, and to provide a first output value, according to said sequence, during each clock cycle of the spread frequency clock signal;
- a control unit (22;27-28) adapted to select a division factor of the programmable clock divider based on the first output value of the FSR during each clock cycle of the spread frequency clock signal;
- an output (53) for providing the spread frequency clock signal.

wherein the spread frequency clock signal is generated from the first clock signal by spreading rising edges and falling edges and wherein the device further comprises a second FSR (29), said second FSR being adapted to generate any of a number M2 of different values, where M2 is equal to a power of two or to an odd number greater than one, wherein said second FSR is adapted to pseudo-randomly generate a second sequence of second output values, each second value corresponding to one of said M2 different values, and to provide a second output value, according to said second sequence during each spread clock cycle, wherein, during each clock cycle of the spread frequency clock signal, a period of the spread frequency clock signal comprises a number of first periods of the first clock signal, which is equal to the division factor selected by the control unit (22; 27-28), and wherein the control unit is further adapted to allocate each first period from the number of first periods to high cycle or low cycle, based on the second output value provided by the second FSR.

According to systems of the prior art, a single long LFSR that controls each change of the spread clock state is a simple implementation, which spreads rising and falling edges at the same time. However, this approach makes it more difficult to predict parameter of spread clock such as average frequency and maximum time excursion versus average frequency, compared to the two LFSR approach of the present invention. Having one shorter LFSR that determines each clock period and another LFSR which is arranged to spread falling edge enables an efficient implementation concerning number of registers to use versus frequency spectrum impact and lets the other parameter (maximum time excursion versus average frequency) easier to predict. Indeed, in the present application, to enable clock spreading of both rising and falling edges, the MLFSR 21 previously described can be replaced by a LFSR delivering binary values, the binary values determining a frequency division factor of the clock signal. The binary value of the other LFSR 29 can thus be used to control the repartition of rising and falling edges.

Figure 4:
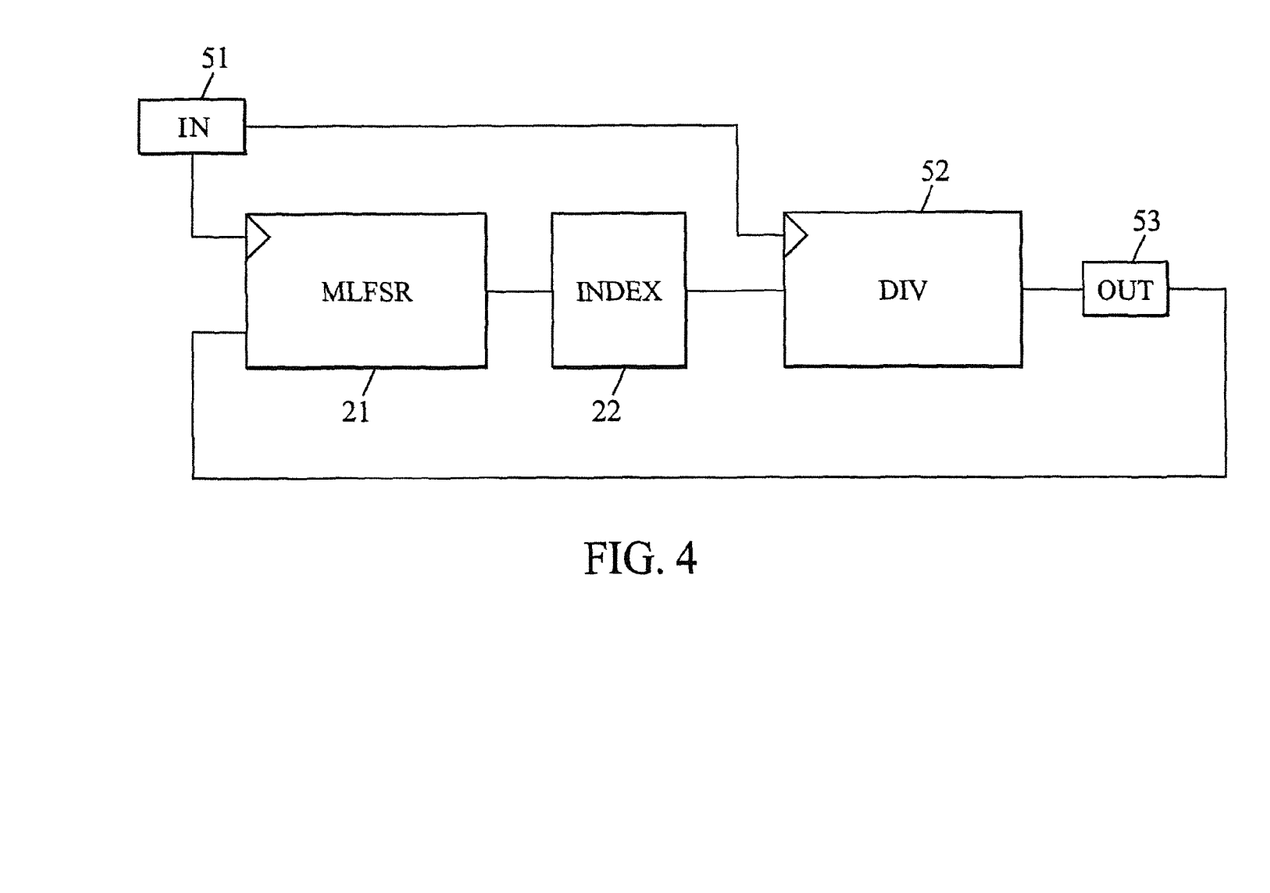
FIG. 4 represents a simplified version of the device according to some embodiments of the invention.

Referring now to FIG. 4, there is shown a simplified version of the device according to some embodiments of the invention.

The device comprises the MLFSR 21 and the index 22 that have already been introduced with reference to FIGS. 2 and 3.

The device further comprises an input 51, which is adapted to receive a (non spread) clock signal. For example, as previously explained, the clock signal can have a clock frequency of 1248 MHz (fast clock).

The input can be connected to the MLFSR 21 and to a programmable clock divider 52. The device further comprises an output 53, adapted to provide the spread frequency clock signal.

The MLFSR 21 comprises at least one stage (one register) and is adapted to generate any of an odd number M of different values and to pseudo-randomly generate a first sequence of first output values, each corresponding to one of the M values. The MLFSR 21 can then output a first output value according to the first sequence and is enabled by the spread clock signal (the enable of the MLFSR is thus connected to the output 53. Thus, the MLFSR 21 can output a first output value at each clock cycle of the spread frequency clock signal. The first output value is transmitted to the index 22.

As it has been previously explained, the index 22 can output a frequency division ratio based on the first output value, the frequency division ratio being transmitted to the programmable clock divider 52.

The programmable clock divider 52 can be adapted to generate the spread frequency clock signal from the clock signal received by the input 51. To this purpose, the programmable clock divider 52 can for example comprise the counter 23 and the comparator 24 that have been represented with reference to FIG. 2.

Figure 5:
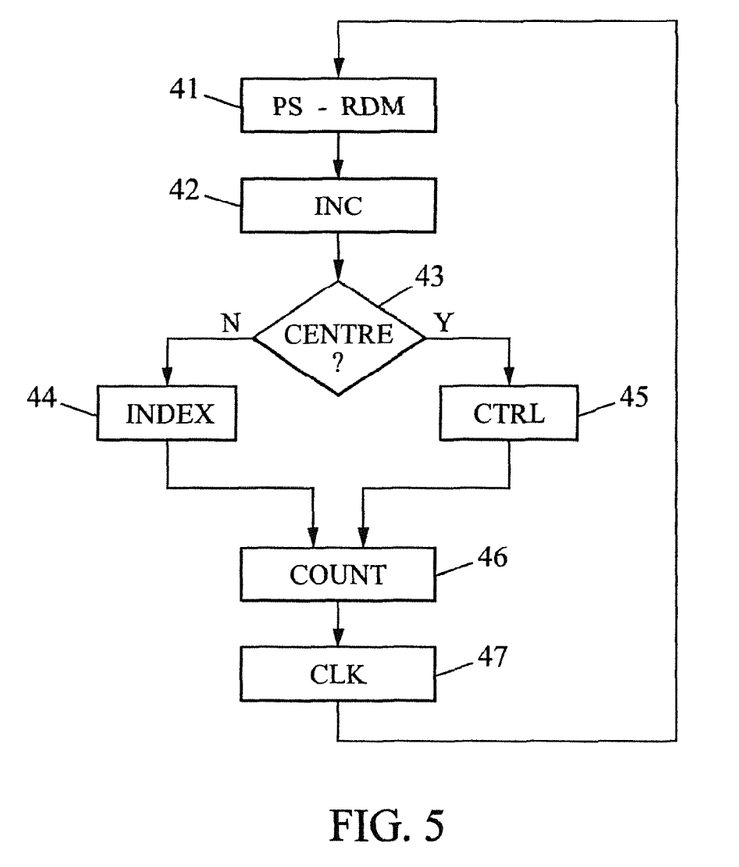
FIG. 5 illustrates a flowchart representing the steps of a method according to some embodiments of the invention.

Referring now to FIG. 5, there is shown a flowchart illustrating the steps of a method according to the invention.

At step 41, at a given output clock cycle, the values stored in the registers of the MLFSR 21 are shifted, the new value to be affected to register 31.1 is calculated (in the case where the five effective registers 31.1-31.5 are considered) and an output value is obtained from register 31.4.

At step 42, a division frequency factor is determined based on a predefined mapping of the index 22 and in the time track counter 27, and the counter value in the time track counter is updated.

At step 44, it is determined whether any other component of the system comprising the device needs the clock time excursion to be re-centred.

If the clock time excursion does not need to be re-centred, then the frequency division factor determined by the index 22 is transmitted to the counter 23 at a step 44.

If the clock time excursion needs to be re-centred, the controller 28 transmits a frequency division factor to the counter 23 that enables to re-centre the time excursion.

Then, at step 46, the counter 23 and the comparator 24 (i.e. the programmable clock divider 52) determine, based on the values of the latches of the LFSR 29 and based on the received frequency division factor, how to control the clock 25, as it has been previously explained.

When the counter 23 reaches zero, at step 47, the clock 25 is toggled and the method is iterated by coming back to step 41.

Figure 6:
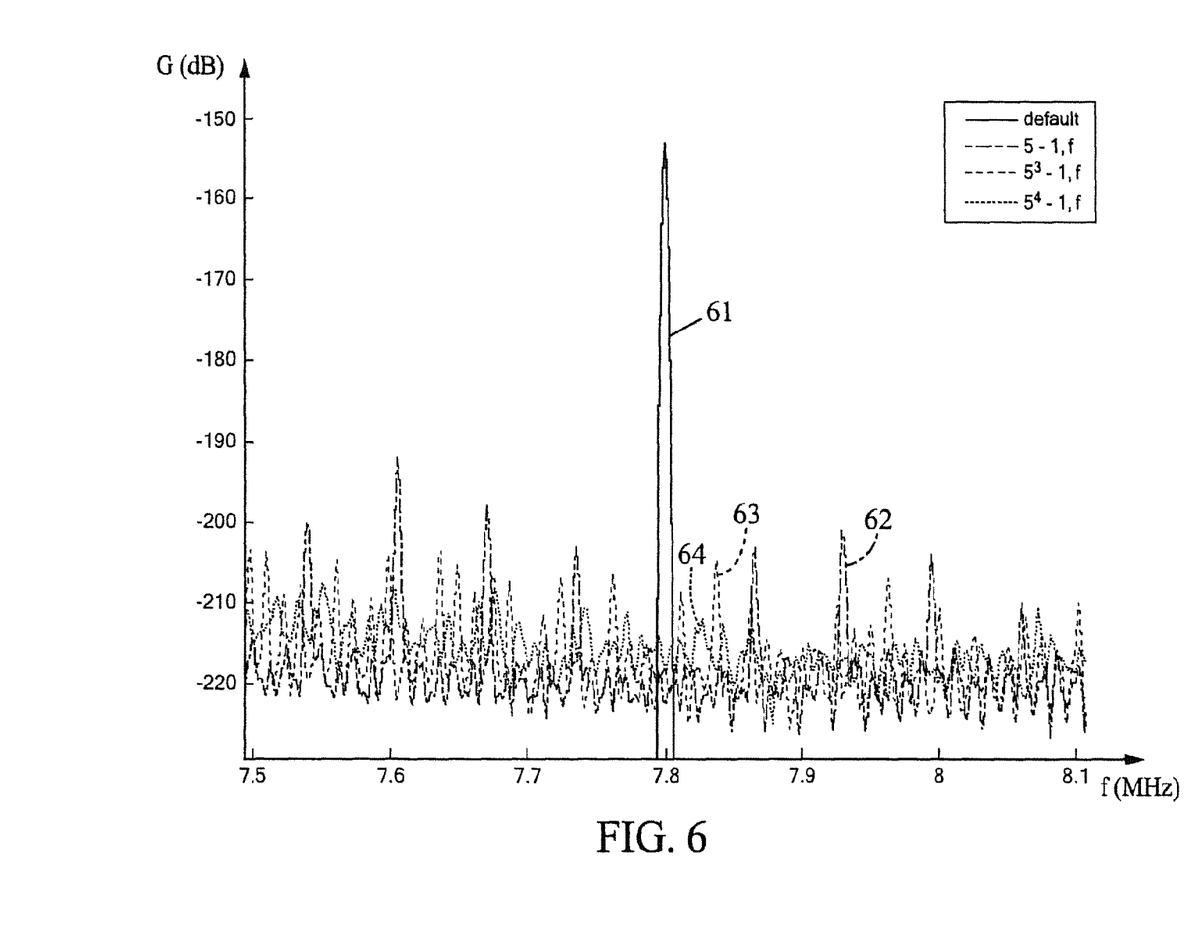
FIG. 6 is a graph presenting theoretical frequency performances of a device according to some embodiments of the invention.

Referring now to FIG. 6, there is shown a graph 60 presenting theoretical frequency performances of a device according to some embodiments of the invention. The graph 60 illustrates the evolution of gain in decibels dB depending on the frequency expressed in MHz, for different configurations of the device according to the invention.

On a first curve 61, a default configuration is illustrated for which no spreading has been performed on the clock signal. A peak is centred around the frequency value 7.8 MHz.

Curve 62 illustrates a configuration of the device according to which the MLFSR 21 comprises two stages and can output five different values (length of the sequence is equal to 24). An attenuation of 34 dB can be observed compared to the default configuration, and new spikes are coming at well identified places, keeping very good noise floor.

Curve 63 illustrates a configuration of the device according to which the MLFSR 21 comprises three stages and can output five different values (length of the sequence is equal to 124). An attenuation of 46 dB can be observed compared to the default configuration.

Curve 64 illustrates a configuration of the device according to which the MLFSR 21 comprises four stages and can output five different values (length of the sequence is equal to 624). An attenuation of 52 dB can be observed compared to the default configuration.

Thus, according to the invention, an efficient clock spreading can be performed even with a short MLFSR 21 comprising a reduced number of stages. In addition, as previously explained, the number of stages of the MLFSR 21 can be configurable, thus enabling to enhance the trade-off between time and frequency accuracies.

These results are based on processing theoretical "square" clock signal.

Thus, the present invention enables to enhance the spreading of a clock signal. Indeed, the invention proposes to use an already used average frequency and it thus transparent for most designs, even with real time counter embedded. In addition, a well known minimum and maximum frequencies are determined, whatever the pseudo random sequence length of the MLFSR 21. Thus, the implementation (back-end) constraints are reduced, and sufficient processing speed is ensured at all time. In addition, the time track counter 27 enables to store the time variation (excursion) relative to a non spread clock. Furthermore, as there are only integer frequency division factors, it is easy to track and to cancel this time variation for short period of time. The present invention is then compatible with any system which is not designed to support clock spreading.

The management of the output clock spurs is also enhanced. Indeed, it is possible by simple programming to change the pseudo random sequence length. For example, one can use short sequence period to reduce spurs and keep a good noise floor and time accuracy. As all frequency division factors are integers, spurs linked to a sequence period fall on already existing clock periods elsewhere in a system comprising the device according to the invention. By using long sequence, a trade-off is assured between spurs and noise floor. In some embodiments, the falling edge of the output clock can be spread independently from the rising edge. This enables to create longer clock sequences without impacting on digital constraints.

In addition, as the values in the MLFSR 21 are shifted on the output clock cycle, there is no need to shift the sequence several times and every cycle gives naturally a division factor. In addition the implementation of the present invention is simple, although a base different than base 2 is used. Indeed, with one hot wire, multiplication by a coefficient can consist in a bus reordering, and is thus free in term of hardware. MLFSR 21 implementation is simple.

The power consumption of the device is also reduced as the sequence is only shifted once per output clock cycle, whatever the number of latches per register and whatever the number of registers are used. Most part of the logic toggles only at the output clock frequency.

Embodiments of the present invention can also be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

Embodiments of the invention have been described above in detail with reference to embodiments thereof. However, as is readily understood by those skilled in the art, other embodiments are equally possible within the scope of the present invention, as defined by the appended claims.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, some embodiments of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. A device for providing a spread frequency clock signal, comprising:
   an input to receive a first clock signal having a first frequency;
   a programmable clock divider to generate the spread frequency clock signal from the first clock signal;
   a first Feedback Shift Register, FSR, comprising at least one stage, said FSR being adapted to generate any of an odd number M of different values, said FSR being adapted to pseudo-randomly generate a first sequence of first output values, each corresponding to one of said M different values, and to provide a first output value, according to said sequence, during each clock cycle of the spread frequency clock signal;
   a control unit adapted to select a division factor of the programmable clock divider based on the first output value of the FSR during each clock cycle of the spread frequency clock signal;
   an output for providing the spread frequency clock signal.

2. The device of claim 1, wherein the control unit selects one of N division factors for each of the M different values, where N is an integer lower than or equal to M, for use by the programmable clock divider.

3. The device of claim 2, wherein the N division factors correspond to N frequency values, each frequency value being the first frequency divided by the respective division factor and wherein the N frequency values include a target average frequency value having an associated target average division factor.

4. The device of claim 3, wherein the control unit selects the division factor based on a mapping between the M first output values and the N division factors $D_i$, varying between 0 and n−1, $D_0$ being the target average division factor, according to the following rules:

$$a_0+a_1+\ldots+a_{N-1}=M$$

$$a_0*D_0+a_1*D_1+\ldots+a_{N-1}*D_{N-1}=M*D_0$$

where $a_i$ represents a number of output values from the M first output values that are mapped on the corresponding factor $D_i$.

5. The device of claim 4, wherein the first output values are comprised between 0 and M−1, and wherein the output value 0 is mapped on the target division factor $D_0$.

6. The device according to claim 3, wherein the numbers of division factors above and below the target division factor are equal.

7. The device according to claim 3, wherein M is equal to N.

8. The device according to claim 3, wherein the control unit further comprises a counter, which is adapted to update, at each clock cycle of the spread frequency clock signal, a count value based on the difference between the division factor selected by the control unit and the target average division factor, said count value being equal to zero when the device is powered up.

9. The device according to claim 8, wherein upon reception of a re-center request from a component of a system comprising said device, the control unit is adapted to select a division factor of the programmable clock divider being adapted to decrease the absolute value of the count value.

10. The device according to claim 1, wherein the spread frequency clock signal is generated from the first clock signal by spreading rising edges and falling edges.

11. The device according to claim 10 further comprising a second FSR, said second FSR being adapted to generate any of a number M2 of different values, where M2 is equal to a power of two or to an odd number greater than one, wherein said second FSR is adapted to pseudo-randomly generate a second sequence of second output values, each second value corresponding to one of said M2 different values, and to provide a second output value, according to said second sequence during each spread clock cycle, wherein, during each clock cycle of the spread frequency clock signal, a period of the spread frequency clock signal comprises a number of first periods of the first clock signal, which is equal to the division factor selected by the control unit, and wherein the control unit is further adapted to allocate each first period from the number of first periods to high cycle or low cycle, based on the second output value provided by the second FSR.

12. The device according to claim 10, wherein the first FSR comprises at least two stages, said pseudo-randomly generated first output value being provided by a first stage among the at least two stages of the first FSR, wherein, during each clock cycle of the spread frequency clock signal, a period of the spread frequency clock signal comprises a number of first periods of the first clock signal, which is equal to the division factor selected by the control unit, and wherein the control unit is further adapted to allocate each first period from the number of first periods to high cycle or low cycle based on a second output value provided by a second stage among the at least two stages of the first FSR.

13. The device according to claim 1, wherein the first FSR comprises a configurable number of stages.

14. A method of providing a spread frequency clock signal, comprising:
   receiving a first clock signal having a first frequency;
   generating the spread frequency clock signal from the first clock signal;
   pseudo-randomly generating, during each clock cycle of the spread frequency clock signal, an output value among M different values, where M is an odd number greater than one;

selecting a division factor based on the output value during each clock cycle of the spread frequency, said division factor being used to generate the spread frequency clock signal; and providing the spread frequency clock signal.

15. A computer program product comprising a non-transitory computer readable medium having stored thereon computer program instructions loadable into a computing device and adapted to—when loaded into and executed by said computing device—cause the computing device to perform a method according to claim 14.

* * * * *